(12) United States Patent
Cadee et al.

(10) Patent No.: US 10,095,128 B2
(45) Date of Patent: Oct. 9, 2018

(54) THERMAL CONDITIONING METHOD

(71) Applicant: ASML NETHERLANDS B.V., Veldhoven (NL)

(72) Inventors: Theodorus Petrus Maria Cadee, Asten (NL); Benjamin Joseph De Smet, Eindhoven (NL); Sjoerd Nicolaas Lambertus Donders, Vught (NL); Adrianus Marinus Verdonck, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/528,187

(22) PCT Filed: Nov. 24, 2015

(86) PCT No.: PCT/EP2015/077426
§ 371 (c)(1),
(2) Date: May 19, 2017

(87) PCT Pub. No.: WO2016/102131
PCT Pub. Date: Jun. 30, 2016

(65) Prior Publication Data
US 2018/0024446 A1    Jan. 25, 2018

(30) Foreign Application Priority Data

Dec. 22, 2014 (EP) ..................... 14199555

(51) Int. Cl.
*G03F 7/20* (2006.01)
*F25B 39/02* (2006.01)
(Continued)

(52) U.S. Cl.
CPC .......... *G03F 7/70875* (2013.01); *G03F 7/708* (2013.01); *G03F 7/70808* (2013.01);
(Continued)

(58) Field of Classification Search
CPC ..................... G03F 7/7716; G03F 7/70875
See application file for complete search history.

(56) References Cited

U.S. PATENT DOCUMENTS

| 2005/0224222 A1 | 10/2005 | Eaton et al. |
| 2008/0055576 A1 | 3/2008 | Auer |

(Continued)

FOREIGN PATENT DOCUMENTS

| DE | 10 2013 111801 | 3/2014 |
| JP | 2008-060567 | 3/2008 |

(Continued)

OTHER PUBLICATIONS

International Search Report and Written Opinion issued in corresponding International Patent Application No. PCT/EP2015/077426, dated Feb. 12, 2016.

(Continued)

*Primary Examiner* — Michelle M Iacoletti
(74) *Attorney, Agent, or Firm* — Pillsbury Winthrop Shaw Pittman, LLP

(57) ABSTRACT

A method of thermally conditioning a physical object, includes guiding a two-phase cooling medium through a cooling duct of the physical object, wherein the guiding includes: guiding the two-phase cooling medium in a liquid phase via a pre-heating duct of the physical object from a supply side of the physical object at least partly towards a discharging side of the physical object, the two-phase cooling medium being pre-heated in the pre-heating duct; guiding the two-phase cooling medium from the pre-heating duct to a phase transitioning duct of the physical object, the two-phase cooling medium at least partly transitioning from the liquid phase towards a gas phase in the phase transitioning duct; guiding the two-phase cooling medium from the phase transitioning duct to a discharging duct of the physical (Continued)

object; and discharging at the discharging side the two-phase cooling medium from the discharging duct.

22 Claims, 6 Drawing Sheets

(51) Int. Cl.
  *G02B 7/02* (2006.01)
  *G02B 7/18* (2006.01)
(52) U.S. Cl.
  CPC ...... *G03F 7/70858* (2013.01); *G03F 7/70891* (2013.01); *F25B 39/02* (2013.01); *F25B 2339/023* (2013.01); *G02B 7/028* (2013.01); *G02B 7/1815* (2013.01)

(56) References Cited

U.S. PATENT DOCUMENTS

2008/0151202 A1* 6/2008 Ohishi ............... G03F 7/70716
                                                    355/30
2010/0126666 A1  5/2010 Tandou et al.
2011/0128517 A1  6/2011 Ottens et al.
2012/0267550 A1 10/2012 Donders et al.

FOREIGN PATENT DOCUMENTS

| JP | 2010-129766 | 6/2010 |
| JP | 2011-530804 | 12/2011 |
| JP | 2012-227528 | 11/2012 |

OTHER PUBLICATIONS

Notice of Reasons for Rejection issued in corresponding Japanese Patent Application No. 2017-526655, dated Jun. 1, 2018.

* cited by examiner

THERMAL CONDITIONING METHOD

CROSS-REFERENCE TO RELATED APPLICATIONS

This application is the U.S. national phase entry of PCT patent application no. PCT/EP2015/077426, which was filed on Nov. 24, 2015, which claims the benefit of priority of European patent application no. 14199555.5, which was filed on Dec. 22, 2014, and which is incorporated herein in its entirety by reference.

BACKGROUND

Field of the Invention

The present invention relates to a method of thermally conditioning a physical object.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In cooling of physical objects, use may be made of so called two phase cooling. Thereby, a cooling medium transitions from a first phase, such as a liquid phase, into a second phase, such as a gas phase. The cooling medium absorbs energy during the transition from liquid phase to gas phase, thereby possibly providing a cooling effect to a surrounding as heat may be drawn from the surrounding. Generally, a heat absorbing capacity of the cooling two phase cooling medium differs depending on the phase thereof. In the liquid as well as in the gas phase, a moderate amount of heat is absorbed, while in the two phase state, in particular in the transition from liquid to gas state, a higher heat absorption may be provided. As a result thereof, two phase cooling systems commonly only make use of a certain gas liquid ratio. Before the two phase cooling medium enters a cooling duct in the physical object, the two phase cooling medium is therefore brought to a state of boiling, whereby a proportion of the liquid already changes to gas. The two phase cooling medium is again discharged for the same reason before the two phase cooling medium has entirely changed to the gas phase, thus to avoid an associated reduction in heat absorbing capacity that would occur when fully or almost fully in the gas phase.

SUMMARY

It is desirable to provide an improved cooling of a physical object.

According to an embodiment of the invention, there is provided a method of thermally conditioning a physical object, comprising:

guiding a two phase cooling medium through a cooling duct provided in the physical object, the cooling duct extending from a supply side of the physical object where the two phase cooling medium enters the cooling duct, to a discharging side of the physical object where the two phase cooling medium discharges from the cooling duct, the cooling duct comprising a pre heating duct, a phase transitioning duct and a discharging duct, wherein the guiding the two phase cooling medium through the cooling duct provided in the physical object comprises:

guiding the two phase cooling medium in a liquid phase via the pre heating duct from the supply side at least partly towards the discharging side of the physical object, the two phase cooling medium being pre-heated in the pre-heating duct;

guiding the two phase cooling medium from the pre heating duct to the phase transitioning duct, the phase transitioning duct extending from the supply side to the discharging side of the physical object, the two phase cooling medium at least partly transitioning from the liquid phase towards a gas phase in the phase transitioning duct;

guiding the two phase cooling medium from the phase transitioning duct to the discharging duct; and discharging at the discharging side the two phase cooling medium from the discharging duct.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing such embodiments in more detail, however, it is instructive to present an example environment in which embodiments of the present invention may be implemented.

Figure 1A:
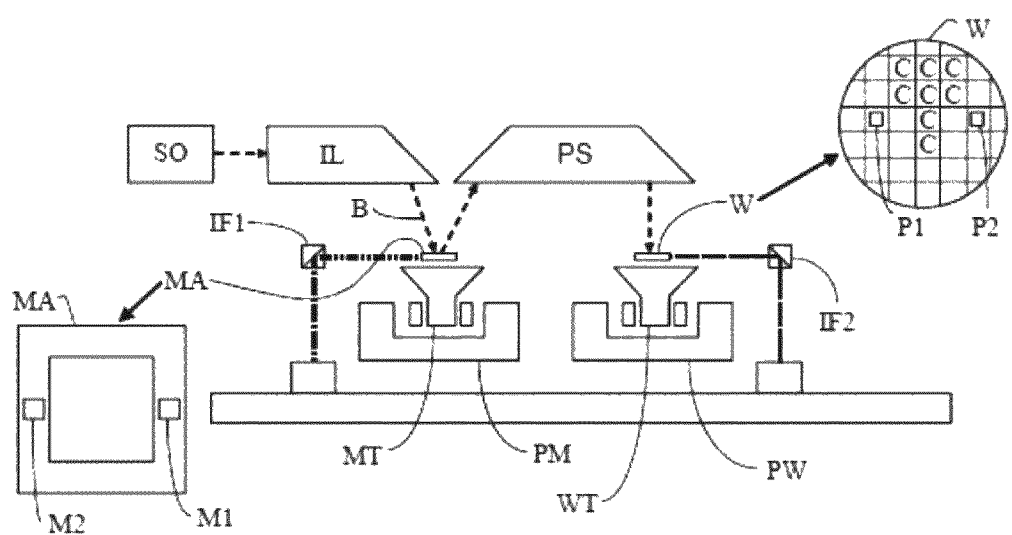
FIG. 1A is a schematic illustration of a reflective lithographic apparatus in which an embodiment of the invention may be provided.
Figure 1B:
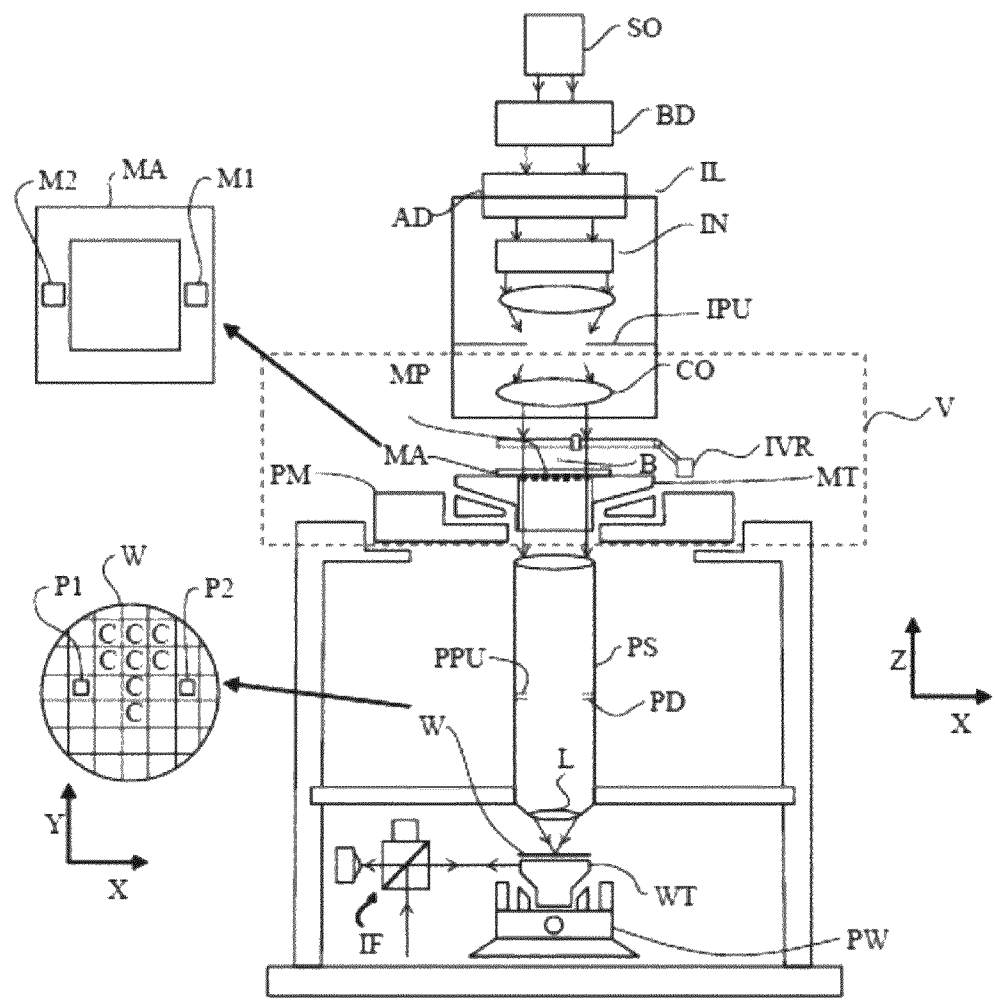
FIG. 1B is a schematic illustration of a transmissive lithographic apparatus in which an embodiment of the invention may be provided.

FIGS. 1A and 1B are schematic illustrations of a lithographic apparatus 100 and lithographic apparatus 100', respectively, in which embodiments of the present invention may be implemented. Lithographic apparatus 100 and lithographic apparatus 100' each include the following: an illumination system (illuminator) IL configured to condition a radiation beam B (for example, DUV or EUV radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatuses 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL may include various types of optical components, such as refractive, reflective, magnetic, electromagnetic, electrostatic, or other types of optical components, or any combination thereof, for directing, shaping, or controlling the radiation B.

The support structure MT holds the patterning device MA in a manner that depends on the orientation of the patterning device MA, the design of the lithographic apparatuses 100 and 100', and other conditions, such as whether or not the patterning device MA is held in a vacuum environment. The support structure MT may use mechanical, vacuum, electrostatic, or other clamping techniques to hold the patterning device MA. The support structure MT can be a frame or a table, for example, which can be fixed or movable, as required. The support structure MT can ensure that the patterning device is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C, such as an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B which is reflected by the mirror matrix.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' can be of a type having two (dual stage) or more substrate tables (and/or two or more mask tables) WT. In such "multiple stage" machines, the additional substrate tables WT can be used in parallel, or preparatory steps can be carried out on one or more tables while one or more other substrate tables WT are being used for exposure.

The lithographic apparatus (in particular the transmissive type as described with reference to FIG. 1B) may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIGS. 1A and 1B, the illuminator IL receives a radiation beam from a radiation source SO. The source SO and the lithographic apparatuses 100, 100' can be separate entities, for example, when the source SO is an excimer laser. In such cases, the source SO is not considered to form part of the lithographic apparatuses 100 or 100', and the radiation beam B passes from the source SO to the illuminator IL with the aid of a beam delivery system BD (in FIG. 1B) including, for example, suitable directing mirrors and/or a beam expander. In other cases, the source SO can be an integral part of the lithographic apparatuses 100, 100'—for example when the source SO is a mercury lamp. The source SO and the illuminator IL, together with the beam delivery system BD, if required, can be referred to as a radiation system.

The illuminator IL can include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 1B), such as an integrator IN and a condenser CO. The illuminator IL can be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil PPU conjugate to an illumination system pupil IPU. Portions of radiation emanate from the intensity distribution at the illumination system pupil IPU and traverse a mask pattern without being affected by diffraction at a mask pattern create an image of the intensity distribution at the illumination system pupil IPU.

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 1B) can be used to accurately position the mask MA with respect to the path of the radiation beam B (for example, after mechanical retrieval from a mask library or during a scan).

In general, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Mask table MT and patterning device MA can be in a vacuum chamber, where an in-vacuum robot IVR can be used to move patterning devices such as a mask in and out of vacuum chamber. Alternatively, when mask table MT and patterning device MA are outside of the vacuum chamber, an out-of-vacuum robot can be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatuses 100 and 100' can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to herein.

Combinations and/or variations on the described modes of use or entirely different modes of use can also be employed.

Although specific reference can be made in this text to the use of lithographic apparatus in the manufacture of ICs, it should be understood that the lithographic apparatus described herein can have other applications, such as the manufacture of integrated optical systems, guidance and detection patterns for magnetic domain memories, flat-panel displays, liquid-crystal displays (LCDs), and thin-film magnetic heads. The skilled artisan will appreciate that, in the context of such alternative applications, any use of the terms "wafer" or "die" herein can be considered as synonymous with the more general terms "substrate" or "target portion," respectively. The substrate referred to herein can be processed, before or after exposure, in for example a track (a tool that typically applies a layer of resist to a substrate and develops the exposed resist), a metrology tool, and/or an inspection tool. Where applicable, the disclosure herein can be applied to such and other substrate processing tools. Further, the substrate can be processed more than once, for example, in order to create a multi-layer IC, so that the term substrate used herein can also refer to a substrate that already contains one or multiple processed layers.

In a further embodiment, lithographic apparatus 100 includes an extreme ultraviolet (EUV) source, which is configured to generate a beam of EUV radiation for EUV lithography. In general, the EUV source is configured in a radiation system (see below), and a corresponding illumination system is configured to condition the EUV radiation beam of the EUV source.

In the embodiments described herein, the terms "lens" and "lens element," where the context allows, can refer to any one or combination of various types of optical components, including refractive, reflective, magnetic, electromagnetic, and electrostatic optical components.

Further, the terms "radiation" and "beam" used herein encompass all types of electromagnetic radiation, including visible radiation (for example, having a wavelength λ in the range of 400 to 780 nm), ultraviolet (UV) radiation (for example, having a wavelength λ of 365, 248, 193, 157 or 126 nm), extreme ultraviolet (EUV or soft X-ray) radiation (for example, having a wavelength in the range of 5-20 nm such as, for example, 13.5 nm), or hard X-ray working at less than 5 nm, as well as particle beams, such as ion beams or electron beams. Generally, radiation having wavelengths between about 780-3000 nm (or larger) is considered IR radiation. UV refers to radiation with wavelengths of approximately 100-400 nm. Within lithography, the term "UV" also applies to the wavelengths that can be produced by a mercury discharge lamp: G-line 436 nm; H-line 405 nm; and/or, I-line 365 nm. Vacuum UV, or VUV (i.e., UV absorbed by air), refers to radiation having a wavelength of approximately 100-200 nm. Deep UV (DUV) generally refers to radiation having wavelengths ranging from 126 nm to 428 nm, and in an embodiment, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

Figure 7:
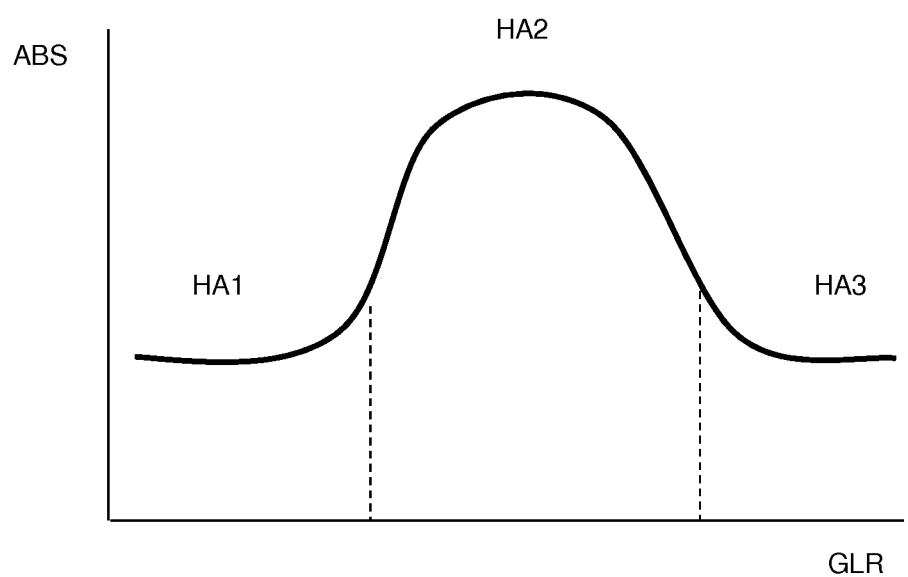
FIG. 7 depicts a graphical view of a heat absorption capacity versus a gas to liquid ratio.

As explained above, in conventional two phase cooling systems, only a part of the transition of the two phase cooling medium from liquid phase to gas phase is used, so as to benefit from the part of the transition where the heat absorption is high, generally being from a gas to liquid ratio of 0.2 to a gas to liquid ratio of 0.6. Below the ratio of 0.2, the two phase cooling medium is largely in the liquid phase and the heat absorption appears to be significantly lower, as the effect of boiling and phase transition only plays a minor role. On the other hand, above the ratio of 0.6, the two phase cooling medium is largely in a gas phase. Additionally, the amount of liquid available to wet a wall of a cooling duct reduces as the gas to liquid ratio increases, which may result in a so called drying-out. As a result, the heat absorption reduces as heat will substantially be accommodated by an increase in gas temperature, rather than by the transition from liquid to gas. An example of such behavior of the heat absorption as a function of the gas to liquid ratio is depicted in FIG. 7. At low gas to liquid ratio, the heat absorption exhibits a value of HA1, where the two phase cooling medium is largely in a liquid phase. Then, upon transitioning towards the gas phase, the heat absorption increases towards a value of HA2. When the gas to liquid ratio further increases towards the gas phase, the heat absorption decreases again towards a value HA3.

A principle of the invention will be explained below with reference to FIG. 2.

Figure 2:
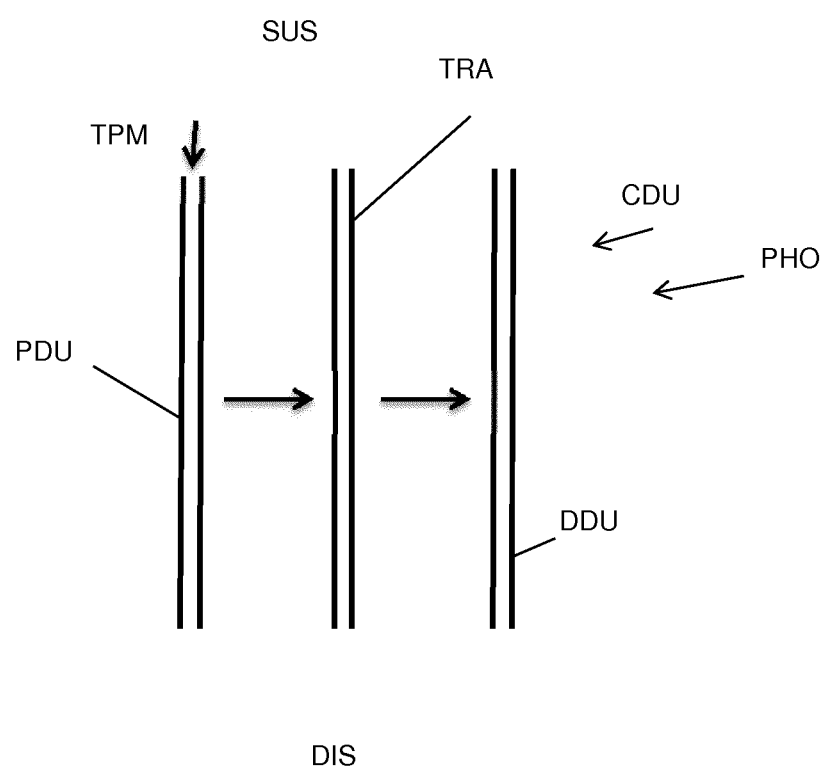
FIG. 2 depicts a schematic view of a cooling in accordance with an embodiment of the invention.

FIG. 2 depicts a highly schematic view of a cooling system in accordance with an embodiment of the invention. The cooling system comprises a cooling duct CDU which extends through the physical object. A two phase cooling medium TPM enters the cooling duct at a supply side SUS of the physical object, flows through the cooling duct and discharges at a discharging side DIS of the physical object. The two phase cooling medium enters the cooling duct at the supply side in liquid form. The temperature of the two phase cooling medium, at the entry, may be below a boiling temperature, at the pressure at which the two phase cooling medium enters the cooling duct. In a first part of the cooling duct, i.e. the pre heating duct PDU, the two phase cooling medium absorbs heat and thereby heats towards its boiling temperature, and due to a start of the boiling process, the gas/liquid ratio starts to change. As an example, when using $CO_2$ as the two phase cooling medium, the gas to liquid ratio will increase from 0 to around 0.2. As explained, due to the transition from liquid to gas, a heat absorption of the cooling medium will increase. In the example of $CO_2$, as of a gas to liquid ratio of around 0.2, the effect of the increased heat absorption by the liquid to gas transition starts to play a major role, resulting in an increase in the heat absorption capability. Preferably at or around a gas to liquid ratio where the heat absorption tends to increase (i.e. around of 0.2 in the case of $CO_2$), the cooling medium is guided into the second part of the cooling duct, namely the transitioning duct TRA. In the second part of the cooling duct, the two phase cooling medium predominantly transitions from the liquid phase into the gas phase, thereby absorbing a relatively large amount of heat. As the gas to liquid ratio increases, as of a certain ratio, the effect of transitioning from liquid to gas starts to diminish. This is because an amount of liquid that is available for evaporation starts to decrease. For example, an amount of liquid on a wall of the cooling duct, available for evaporation, starts to decrease. The wall of the cooling duct, that may initially be wet by liquid cooling medium, may start to dry. The liquid is then discharged from the transitioning duct into a discharging duct DDU of the cooling duct. In the schematic illustration as depicted in FIG. 2, the connections between the preheating duct, transitioning duct and discharging duct are schematically depicted as arrows. Various possible embodiments will be described below.

Reverting to FIG. 2, the transitioning duct extends from the supply side SUS to the discharging side DIS of the physical object. As a result, the effect of high heat absorption capacity occurs from the supply side to the discharging side, causing a distribution of this heat absorption over the physical object. The pre-heating duct extends from the supply side of the physical object in a direction towards the discharging side. Preferably, the pre-heating duct, extends from the supply side to the discharging side of the physical object, so as to provide a relatively uniform heat absorption over the physical object, whereby—as seen from supply side to discharging side—both the lower heat absorption in the pre-heating duct as well as the higher heat absorption in the transitioning duct, contribute to the heat absorption across the physical object.

An example of the physical object may be a substrate table in a lithographic apparatus. Thus, the setup as described above may be used to temperature condition a substrate table of a lithographic apparatus. The two phase cooling medium may for example be pressurized Carbon Dioxide ($CO_2$). In such a situation, the substrate table cooling may provide one of more of the following advantages:

a flow of the two phase cooling medium, e.g. $CO_2$, may be reduced, which may result in smaller flow induced disturbance forces acting on the positioning actuators. Additionally, the lower flow of $CO_2$ may allow to make use of smaller $CO_2$ piping, which may in turn reduce forces on the substrate table;

a pre-heating of the two phase cooling medium may be omitted, which may result in a higher reliability as associated pre-heating and pre-heating control may be omitted; and less cooling ducts may be required to achieve a similar cooling capacity, which may potentially result in less maintenance.

The two phase cooling medium may be any two phase cooling medium, such as Carbon Dioxide $CO_2$ which liquefies at room temperature at a pressure of approximately 60 bars. Media other than $CO_2$ may also be used for phase-change cooling, such as the following fluids, each given with its pressure required for saturation temperature at 22 degrees Celsius: Ammonia—9 bar; H2S—19 bar; R32—15 bar; propane—9 bar; R22—9.6 bar; 2-butene—2.1 bar; R41—35 bar; $N_2O$—53 bar; ethane—39 bar; propylene—11 bar; DME—5.4 bar; R134a—6 bar. A benefit of $CO_2$ and of the fluids mentioned above is that the pressures are relatively high, which results in a relatively low pressure drop in the cooling system compared to fluids at lower pressures. The effect of a relatively low pressure drop in the cooling system combined with a lower sensitivity of the temperature to the pressure drop results in reduced temperature variations of the fluid inside the cooling system. From that point of view, the use of $CO_2$ is beneficial as this requires the highest pressure. An additional benefit of $CO_2$ is that the heat transfer rate for $CO_2$ is rated linear with the heat flux, which means that the temperature remains stable and independent of the heat load. For some context information, please see e.g., US 2012/0267550 incorporated herein by reference. The supply side and discharging side may be provided at opposite sides of the physical object. For example, in the case of the physical object being a substrate table, the supply side and discharging side may be at opposite sides of the substrate table. Other examples may be provided. For example, in the case of a physical object having a rectangular or square footprint, the supply side and discharging side may be at neighboring sides, i.e. at sides that are under and angle of 90 degrees in respect of each other.

It is noted that, although the examples describe and depict a single pre heating duct, transitioning duct and discharging duct, a cooling system according to the invention may comprise a plurality of such assemblies of pre heating duct, transitioning duct and discharging duct in parallel.

Figure 3:
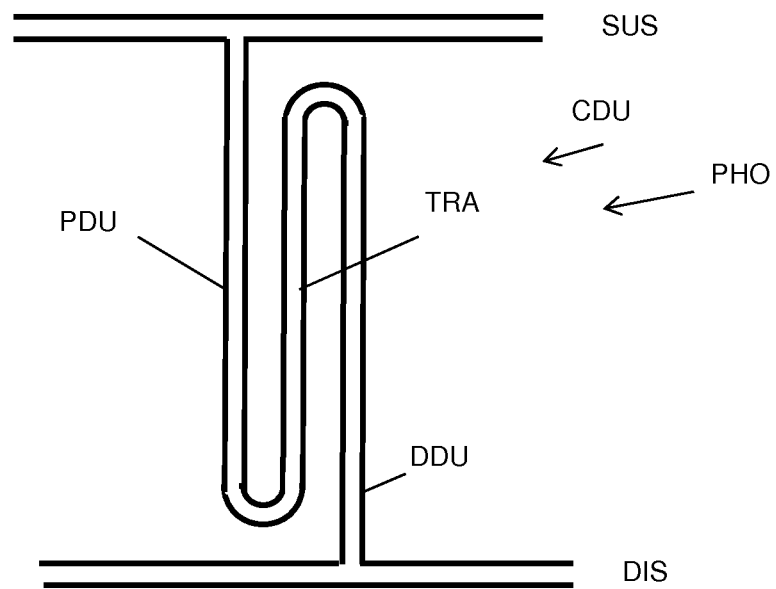
FIG. 3 depicts a schematic view of a cooling duct in accordance with an embodiment of the invention.

An embodiment of the cooling duct is depicted in FIG. 3. In this embodiment, the preheating duct PDU, transitioning duct TRA and discharging duct DDU form a meander. The pre-heating duct extends from the supply side to the discharging side of the physical object. A turn at the discharging side connects the pre-heating duct to the transitioning duct. The preheating duct thus discharges into the transitioning duct at the discharging side SUS of the physical object PHO. The transitioning duct extends from the discharging side of the physical object to a supply side of the physical object. A turn at the supply side connects the transitioning duct to the discharging duct. The transitioning duct thus discharges into the discharging duct at the supply side of the physical object. As pre-heating duct, transitioning duct and discharging duct extend from the supply side to the discharging side of the physical object, different parts of the physical object are subject to cooling by each one of the pre-heating duct, transitioning duct and discharging duct. Therefore, a relatively uniform cooling may be achieved, despite the fact that a cooling effect of the pre-heating duct, transitioning duct and discharging duct may differ from one another. The uniform cooling effect may also be enhanced by the two phase cooling medium in the pre-heating duct and the transitioning duct being in counter flow, as well as by the two phase cooling medium in the transitioning duct and discharging duct being in counter flow. In order to achieve a similar geometry at various locations of the physical object, the pre-heating duct, transitioning duct and discharging duct may extend parallel to each other.

Figure 4:
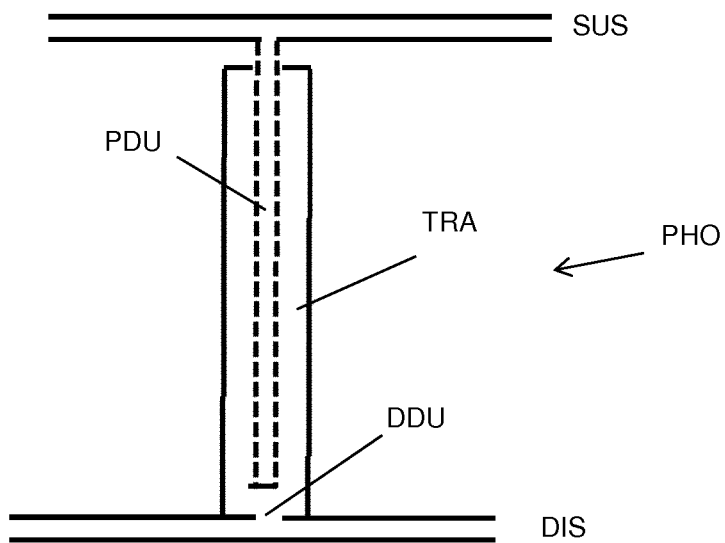
FIG. 4 depicts a schematic view of a cooling duct in accordance with an embodiment of the invention.

Another embodiment is depicted in FIG. 4. In this embodiment, the preheating duct PDU extends from the supply side SUS to the discharging side DIS. The preheating duct is, along a length thereof, provided with openings that discharge into the transitioning duct TRA. The transitioning duct likewise extends from the supply side to the discharging side of the physical object. In an embodiment, the transitioning duct is formed coaxially around the pre heating duct. In another embodiment, the transitioning duct is arranged between the pre heating duct and a to be cooled surface of the physical object. An example of the to be cooled surface of the physical object may be the surface of the substrate table, in the case of the physical object being a lithographic apparatus substrate table. The openings in the pre heating duct may be configured to provide a flow of the two phase cooling medium in liquid form, which flows against an outer wall of the transitioning duct. The liquid two phase cooling medium may for example be injected via the openings from the pre heating duct into the transitioning duct, thereby being sprayed on the outer wall of the transitioning duct. At the outer wall of the transitioning duct, the two phase cooling medium in liquid form will start to boil and evaporate, thereby absorbing a large amount of heat. As the openings in the pre heating duct are provided along a length of the transitioning duct, a supply of two phase cooling medium, substantially in liquid form, onto an outer wall of the transitioning duct may be provided, thus enabling an evaporation (and consequential heat absorption) of the two phase cooling medium along the length of the transitioning duct.

In the embodiment as depicted in FIG. 4, the discharging duct DDU is provided at an end of the transitioning duct facing the discharging side of the physical object. Alternatively, the discharging duct may connect to the transitioning duct at the supply side of the physical object, whereby the discharging duct extends e.g. parallel to the transitioning duct to discharge the two phase cooling medium from the physical object at the discharging side of the physical object. As a result, some additional cooling effect may be provided in that the two phase cooling medium may further absorb some heat when flowing through the discharging duct from the supply side to the discharging side of the physical object.

Figure 5:
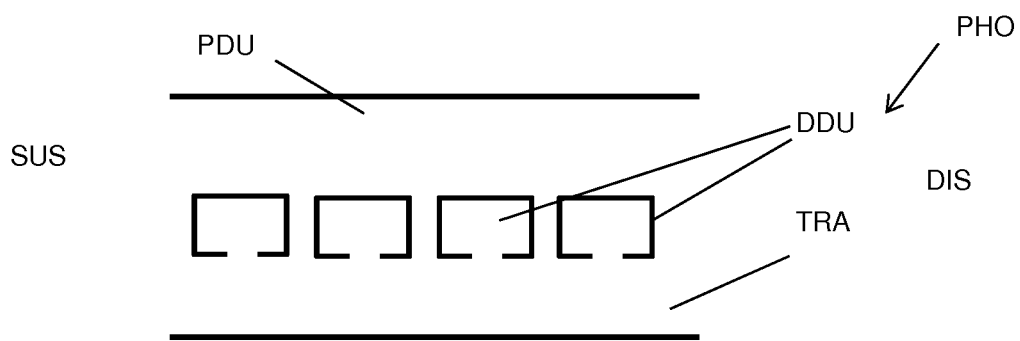
FIG. 5 depicts a schematic view of a cooling duct in accordance with an embodiment of the invention.

FIG. 5 depicts an embodiment wherein the preheating duct PDU extends from the supply side SUS to the discharging side DIS. The preheating duct is, along a length thereof, provided with openings that discharge into the transitioning duct TRA. The transitioning duct likewise extends from the supply side to the discharging side of the physical object. In an embodiment, the transitioning duct is arranged between the pre heating duct and a to be cooled surface of the physical object. An example of the to be cooled surface of the physical object may be the surface of the substrate table, in the case of the physical object being a lithographic apparatus substrate table. The openings in the pre heating duct may be configured to provide a flow of the two phase cooling medium in liquid form, which flows against an outer wall of the transitioning duct. The liquid two phase cooling medium may for example be injected via the openings from the pre heating duct into the transitioning duct, thereby being sprayed on the outer wall of the transitioning duct. At the outer wall of the transitioning duct, the two phase cooling medium in liquid form will start to boil and evaporate, thereby absorbing a large amount of heat. As the openings in the pre heating duct are provided along a length of the transitioning duct, a supply of two phase cooling medium, substantially in liquid form, onto an outer wall of the transitioning duct may be provided, thus enabling an evaporation (and consequential heat absorption) of the two phase cooling medium along the length of the transitioning duct. The discharging duct likewise extends from the supply side of the physical object to the discharging side of the physical object. A plurality of openings may be provided in the transitioning duct, the openings extending along a length of the transitioning duct and discharging into the discharging duct. As a result, once the two phase cooling medium has evaporated to a substantial amount in the transitioning duct, it may be quickly discharged into the discharging duct, along a high throughput of cooling medium, hence a high cooling power. In the embodiment as shown, the openings that discharge into the discharging duct are arranged between the openings from the inlet duct into the transitioning duct. In the embodiment as depicted, the discharging duct is arranged between the pre heating duct and the transitioning duct. In the second part of the cooling duct, the two phase cooling medium predominantly transitions from the liquid phase into the gas phase, thereby absorbing a relatively large amount of heat.

Figure 6:
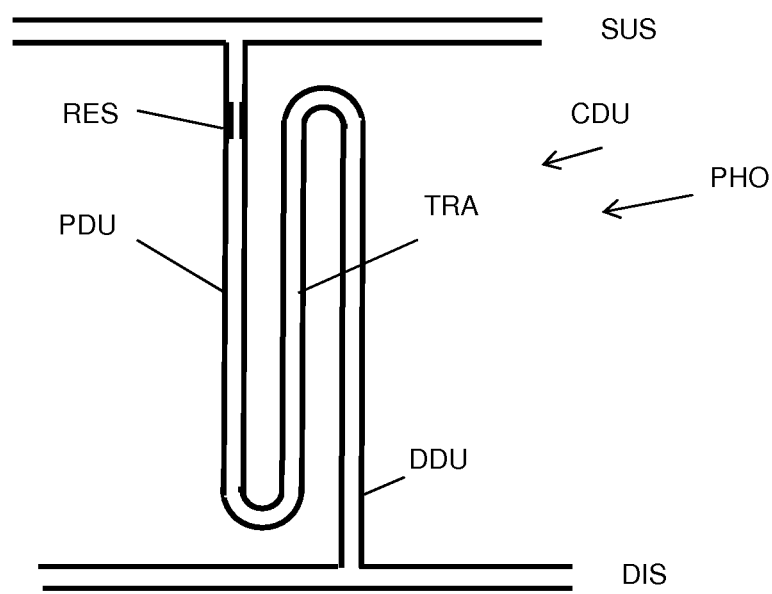
FIG. 6 depicts a schematic view of a cooling duct in accordance with an embodiment of the invention.

FIG. 6 depicts an embodiment wherein a restriction RES is provided between the pre heating duct and the transitioning duct. The restrictions provides a narrowing of the diameter, resulting in a pressure drop of the two phase cooling medium downstream of the restriction as compared a pressure of the two phase cooling medium upstream of the restriction. As a result of the pressure drop, the two phase cooling medium will transition (at a same temperature) from a liquid state into a state where evaporation begins. The restriction may thereby accurately enable a defining of a location of a start of the evaporation and associated heat absorbing.

In an embodiment, there is provided a method of thermally conditioning a physical object, the method comprising: guiding a two-phase cooling medium through a cooling duct provided in the physical object, the cooling duct extending from a supply side of the physical object where the two-phase cooling medium enters the cooling duct, to a discharging side of the physical object where the two-phase cooling medium discharges from the cooling duct, the cooling duct comprising a pre-heating duct, a phase transitioning duct and a discharging duct, wherein the guiding the two-phase cooling medium through the cooling duct provided in the physical object comprises: guiding the two-phase cooling medium in a liquid phase via the pre-heating duct from the supply side at least partly towards the discharging side of the physical object, the two-phase cooling medium being pre-heated in the pre-heating duct; guiding the two-phase cooling medium from the pre-heating duct to the phase transitioning duct, the phase transitioning duct extending from the supply side to the discharging side of the physical object, the two-phase cooling medium at least partly transitioning from the liquid phase towards a gas phase in the phase transitioning duct; guiding the two-phase cooling medium from the phase transitioning duct to the discharging duct; and discharging at the discharging side the two-phase cooling medium from the discharging duct.

In an embodiment, the two-phase cooling medium exhibits an increased heat absorption in a transition range of gas to liquid ratio's during the transition from being substantially in liquid phase to being substantially in gas phase, the increased heat absorption being in respect to the heat absorption of the two-phase cooling medium in the liquid phase and gas phase respectively, a gas to liquid ratio of the two-phase cooling medium in the pre-heating duct being below the transition range, the gas to liquid ratio of the two-phase cooling medium in the transitioning duct being in the transition range, and the gas to liquid ratio of the two-phase cooling medium in the discharging duct being above the transition range. In an embodiment, the gas to liquid ratio of the two-phase cooling medium in the pre-heating duct is in a range of 0-0.2, the gas to liquid ratio of the two-phase cooling medium in the phase transitioning duct is in a range of 0.2-0.6, and the gas to liquid ratio of the two-phase cooling medium in the discharging duct is in a range of 0.6-1. In an embodiment, the method comprises the transitioning duct thermally interacting with the pre-heating duct via a material of the physical object, the discharging duct thermally interacting with the transitioning duct via the material of the physical object. In an embodiment, the two-phase cooling medium in the transitioning duct flows in counterflow in respect of the pre-heating duct. In an embodiment, the pre-heating duct, transitioning duct and discharging duct form a meander, the transitioning duct extending parallel and in opposite flow direction to the pre-heating duct, the discharging duct extending parallel and in opposite flow direction to the transitioning duct. In an embodiment, the pre-heating duct is provided with openings along a length thereof, the openings discharging into the phase transitioning duct. In an embodiment, the discharging duct is provided at an end of the phase transitioning duct facing the discharging side of the physical object. In an embodiment, the discharging duct is formed as discharging guides between the openings from inlet duct to phase transitioning duct. In an embodiment, the discharging duct is arranged between the pre-heating duct and the phase transitioning duct. In an embodiment, a restriction is provided between the pre-heating duct and the phase transitioning duct, the restriction providing a pressure drop of the two-phase cooling medium.

What is claimed is:

1. A physical object, comprising:
   a cooling duct provided in the physical object, the cooling duct extending from a supply side of the physical object configured to receive a two-phase cooling medium into the cooling duct, to a discharging side of the same physical object configured to discharge the two-phase cooling medium from the cooling duct,
   the cooling duct comprising a pre-heating duct, a phase transitioning duct and a discharging duct,
   the pre-heating duct configured to guide the two-phase cooling medium in a liquid phase from the supply side at least partly towards the discharging side, the pre-heating duct configured to pre-heat the two-phase cooling medium and the pre-heating duct absorbing heat from the same physical object,
   the phrase transitioning duct configured to guide the two-phase cooling medium from the pre-heating duct to the discharging duct, the phase transitioning duct extending from the supply side to the discharging side, the phase transitioning duct configured such that the two-phase cooling medium at least partly transitions from the liquid phase towards a gas phase in the transitioning duct in the same physical object, and
   the discharging duct configured to guide the two-phase cooling medium to a discharge at the discharging side,
   wherein the two-phase cooling medium exhibits an increased heat absorption in a transition range of gas to liquid ratios during the transition from being substantially in liquid phase to being substantially in gas phase, the increased heat absorption being in respect to the heat absorption of the two-phase cooling medium in the liquid phase and gas phase respectively, wherein the cooling duct comprising the two-phase cooling medium provides a gas to liquid ratio of the two-phase cooling medium in the pre-heating duct below the transition range, provides the gas to liquid ratio of the two-phase cooling medium in the transitioning duct in the transition range, and provides the gas to liquid ratio of the two-phase cooling medium in the discharging duct above the transition range.

2. The physical object according to claim 1, wherein the gas to liquid ratio of the two-phase cooling medium in the pre-heating duct is in a range of 0-0.2, the gas to liquid ratio of the two-phase cooling medium in the phase transitioning duct is in a range of 0.2-0.6, and the gas to liquid ratio of the two-phase cooling medium in the discharging duct is in a range of 0.6-1.

3. The physical object according to claim 1, comprising the transitioning duct thermally interacting with the pre-heating duct via a material of the physical object, and the discharging duct thermally interacting with the transitioning duct via the material of the physical object.

4. The physical object according to claim 1, wherein the transitioning duct and the pre-heating duct are arranged such that the two-phase cooling medium in the transitioning duct flows in counterflow in respect of the pre-heating duct.

5. The physical object according to claim 1, wherein the pre-heating duct, transitioning duct and discharging duct form a meander, the transitioning duct extending parallel and in opposite flow direction to the pre-heating duct, and the discharging duct extending parallel and in opposite flow direction to the transitioning duct.

6. The physical object according to claim 5, wherein the discharging duct is provided at an end of the phase transitioning duct facing the discharging side of the physical object.

7. The physical object according to claim 1, wherein the pre-heating duct is provided with openings along a length thereof, the openings discharging into the phase transitioning duct.

8. The physical object according to claim 1, wherein a restriction is provided between the pre-heating duct and the phase transitioning duct, the restriction providing a pressure drop of the two-phase cooling medium.

9. The physical object according to claim 1, wherein the physical object is a substrate table of a lithographic apparatus.

10. The physical object according to claim 1, wherein the discharging duct is arranged between the pre-heating duct and the phase transitioning duct.

11. The physical object according to claim 1, wherein openings from the pre-heating duct to the phase transitioning duct are arranged between openings into the discharging duct.

12. A lithographic apparatus, comprising:
a patterning system configured to transfer a pattern onto a substrate; and
a physical object comprising:
a cooling duct provided in the physical object, the cooling duct extending from a supply side of the physical object configured to receive a two-phase cooling medium into the cooling duct, to a discharging side of the same physical object configured to discharge the two-phase cooling medium from the cooling duct,
the cooling duct comprising a pre-heating duct, a phase transitioning duct and a discharging duct,
the pre-heating duct configured to guide the two-phase cooling medium in a liquid phase from the supply side at least partly towards the discharging side, the pre-heating duct configured to pre-heat the two-phase cooling medium and the pre-heating duct absorbing heat from the same physical object,
the phrase transitioning duct configured to guide the two-phase cooling medium from the pre-heating duct to the discharging duct, the phase transitioning duct extending from the supply side to the discharging side, the phase transitioning duct configured such that the two-phase cooling medium at least partly transitions from the liquid phase towards a gas phase in the transitioning duct in the same physical object, and
the discharging duct configured to guide the two-phase cooling medium to a discharge at the discharging side,
wherein the two-phase cooling medium exhibits an increased heat absorption in a transition range of gas to liquid ratios during the transition from being substantially in liquid phase to being substantially in gas phase, the increased heat absorption being in respect to the heat absorption of the two-phase cooling medium in the liquid phase and gas phase respectively, wherein the cooling duct comprising the two-phase cooling medium provides a gas to liquid ratio of the two-phase cooling medium in the pre-heating duct below the transition range, provides the gas to liquid ratio of the two-phase cooling medium in the transitioning duct in the transition range, and provides the gas to liquid ratio of the two-phase cooling medium in the discharging duct above the transition range.

13. The apparatus according to claim 12, wherein the gas to liquid ratio of the two-phase cooling medium in the pre-heating duct is in a range of 0-0.2, the gas to liquid ratio of the two-phase cooling medium in the phase transitioning duct is in a range of 0.2-0.6, and the gas to liquid ratio of the two-phase cooling medium in the discharging duct is in a range of 0.6-1.

14. The apparatus according to claim 12, comprising the transitioning duct thermally interacting with the pre-heating duct via a material of the physical object, and the discharging duct thermally interacting with the transitioning duct via the material of the physical object.

15. The apparatus according to claim 12, wherein the transitioning duct and the pre-heating duct are arranged such that the two-phase cooling medium in the transitioning duct flows in counterflow in respect of the pre-heating duct.

16. The apparatus according to claim 12, wherein the pre-heating duct, transitioning duct and discharging duct form a meander, the transitioning duct extending parallel and in opposite flow direction to the pre-heating duct, and the discharging duct extending parallel and in opposite flow direction to the transitioning duct.

17. The apparatus according to claim 12, wherein the pre-heating duct is provided with openings along a length thereof, the openings discharging into the phase transitioning duct.

18. The apparatus according to claim 17, wherein the discharging duct is provided at an end of the phase transitioning duct facing the discharging side of the physical object.

19. The apparatus according to claim 12, wherein a restriction is provided between the pre-heating duct and the phase transitioning duct, the restriction providing a pressure drop of the two-phase cooling medium.

20. The apparatus according to claim 12, wherein the physical object is a substrate table configured to support the substrate.

21. The apparatus according to claim 12, wherein the discharging duct is arranged between the pre-heating duct and the phase transitioning duct.

22. The apparatus according to claim 12, wherein openings from the pre-heating duct to the phase transitioning duct are arranged between openings into the discharging duct.

* * * * *